United States Patent
Wu et al.

(10) Patent No.: US 7,989,884 B2
(45) Date of Patent: Aug. 2, 2011

(54) STRUCTURE FOR MAKING A TOP-SIDE CONTACT TO A SUBSTRATE

(75) Inventors: Chun-Tai Wu, West Jordan, UT (US);
Ihsiu Ho, Salt Lake City, UT (US)

(73) Assignee: Fairchild Semiconductor Corporation, San Jose, CA (US)

( * ) Notice: Subject to any disclaimer, the term of this patent is extended or adjusted under 35 U.S.C. 154(b) by 133 days.

(21) Appl. No.: 12/359,670

(22) Filed: Jan. 26, 2009

(65) Prior Publication Data
US 2009/0194812 A1    Aug. 6, 2009

Related U.S. Application Data

(63) Continuation of application No. 11/694,704, filed on Mar. 30, 2007, now Pat. No. 7,482,645.

(51) Int. Cl.
*H01L 29/66* (2006.01)
(52) U.S. Cl. .................. 257/330; 257/E29.262
(58) Field of Classification Search .................. 257/330, 257/E29.262
See application file for complete search history.

(56) References Cited

U.S. PATENT DOCUMENTS

| | | | |
|---|---|---|---|
| 4,487,639 A | 12/1984 | Lam et al. | |
| 4,908,328 A | 3/1990 | Hu et al. | |
| 5,349,224 A | 9/1994 | Gilbert et al. | |
| 5,451,538 A | 9/1995 | Fitch et al. | |
| 5,780,343 A | 7/1998 | Bashir | |
| 6,204,098 B1 | 3/2001 | Anceau | |
| 6,373,100 B1 | 4/2002 | Pages et al. | |
| 6,392,290 B1 | 5/2002 | Kasem et al. | |
| 6,420,750 B1 | 7/2002 | Divakaruni et al. | |
| 6,653,740 B2 * | 11/2003 | Kinzer et al. ................. | 257/778 |
| 7,262,099 B2 | 8/2007 | Sandhu et al. | |
| 7,345,342 B2 | 3/2008 | Challa et al. | |
| 7,482,645 B2 | 1/2009 | Wu et al. | |
| 2006/0148178 A1 | 7/2006 | Bonart et al. | |
| 2006/0157715 A1 | 7/2006 | Lim | |

FOREIGN PATENT DOCUMENTS

TW    200845156 A    11/2008
(Continued)

OTHER PUBLICATIONS

Notice of Allowance for U.S. Appl. No. 11/694,704, mailed May 23, 2008, 7 pages.
(Continued)

*Primary Examiner* — Bradley K Smith
*Assistant Examiner* — Mohammad Karimy
(74) *Attorney, Agent, or Firm* — Kilpatrick Townsend & Stockton LLP (57) ABSTRACT

A semiconductor structure includes a starting semiconductor substrate having a recessed portion. A semiconductor material is formed in the recessed portion, and has a higher resistivity than the starting semiconductor substrate. A body region extends in the semiconductor material, and has a conductivity type opposite that of the semiconductor material. Source regions extend in the body region, and have a conductivity type opposite that of the body region. A gate electrode extends adjacent to but is insulated from the body region. A first interconnect layer extends over and is in contact with a non-recessed portion of the starting semiconductor substrate. The first interconnect layer and the non-recessed portion provide a top-side electrical contact to portions of the starting semiconductor substrate underlying the semiconductor material.

15 Claims, 8 Drawing Sheets

FOREIGN PATENT DOCUMENTS

WO 2008/121479 A2 10/2008

OTHER PUBLICATIONS

Notice of Allowance for U.S. Appl. No. 11/694,704, mailed Sep. 22, 2008, 8 pages.

International Search Report of the International Searching Authority for PCT Application No. PCT/US2008/055466, mailed Sep. 9, 2008, 3 pages.

Written Opinion of the International Searching Authority for PCT Application No. PCT/US2008/055466, mailed Sep. 9, 2008, 3 pages.

* cited by examiner

STRUCTURE FOR MAKING A TOP-SIDE CONTACT TO A SUBSTRATE

CROSS-REFERENCES TO RELATED APPLICATIONS

This application is a continuation of U.S. application Ser. No. 11/694,704, filed Mar. 30, 2007, which is incorporated herein by reference in its entirety for all purposes.

BACKGROUND OF THE INVENTION

The present invention relates in general to semiconductor devices, and more particularly to a method and structure for making a top-side contact to a semiconductor substrate.

Figure 1A:
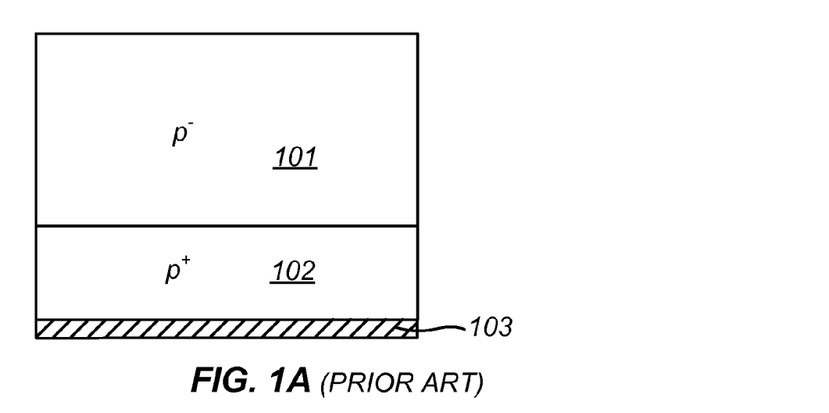
FIGS. 1A-1C are cross-sectional views of structures illustrating conventional techniques for contacting a bottom terminal of a device.
Figure 1B:
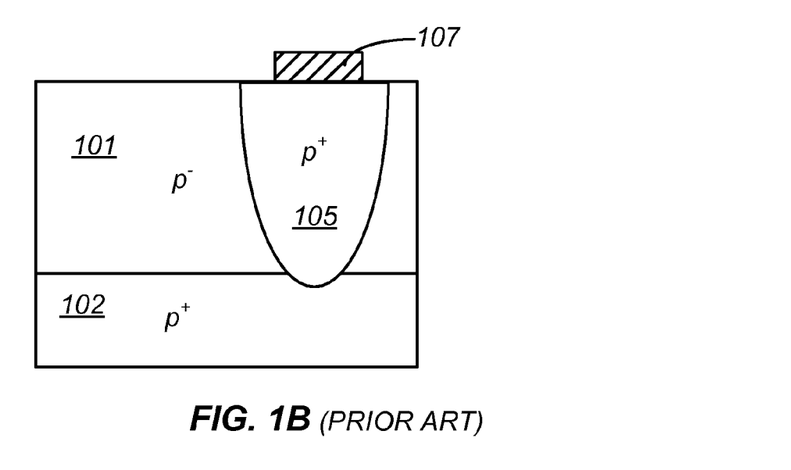
Figure 1C:
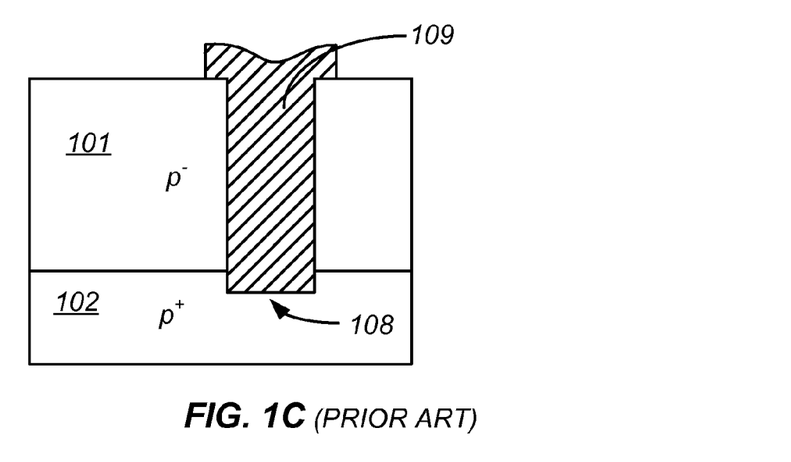

In some semiconductor devices (e.g., vertically-conducting power devices), the substrate forms a bottom terminal of the device, and various techniques have been used to form a low resistance contact to the bottom terminal. FIG. 1A shows a cross-sectional view of a conventional device structure with a back-side contact. As shown, a p− region 101 is formed over a p+ substrate region 102. A conductive interconnect layer 103 formed at the bottom of the substrate is used as a back-side contact. For certain applications, it may be desirable to contact the substrate from the top-side of the device. FIGS. 1B-1C show cross-section views illustrating two conventional techniques for contacting the bottom terminal of a device through the top-side.

In FIG. 1B, a heavily doped diffused region 105 extends through p− region 101 to reach p+ substrate region 102. A conductive interconnect layer 107 is formed over diffused region 105, which together with diffused region 105 forms a top-side contact to p+ substrate region 102. In FIG. 1C, a deep trench 108 is formed through p− region 101 to reach p+ substrate region 102. Then a conductive material 109 is used to fill the trench, thus forming a top-side contact to p+substrate region 102.

Even though these conventional techniques have been used for making top-side contact to the bottom terminal, there are limitations associated with these techniques. For example, diffused region 105 in FIG. 1B requires a high temperature drive-in process after a diffusion or implant step. This leads to wide lateral out-diffusion and high thermal budget. In FIG. 1C, the process of making a deep trench and then filling it with a conductive material is often complicated. If polysilicon is used to fill the trench, it is often difficult to obtain highly doped polysilicon to form a low resistivity top-side contact.

Thus, there is a need for a technique whereby a low resistance top-side contact is made to the substrate while maintaining a simple manufacturing process.

In accordance with an embodiment of the invention, a semiconductor structure includes a starting semiconductor substrate having a recessed portion. A semiconductor material is formed in the recessed portion, and has a higher resistivity than the starting semiconductor substrate. A body region extends in the semiconductor material, and has a conductivity type opposite that of the semiconductor material. Source regions extend in the body region, and have a conductivity type opposite that of the body region. A gate electrode extends adjacent to but is insulated from the body region. A first interconnect layer extends over and is in contact with a non-recessed portion of the starting semiconductor substrate. The first interconnect layer and the non-recessed portion provide a top-side electrical contact to portions of the starting semiconductor substrate underlying the semiconductor material.

In one embodiment, the recessed portion is substantially filled with an epitaxial layer.

In still another embodiment, the semiconductor structure further includes a dielectric spacer vertically extending between the semiconductor material and a non-recessed portion of the starting semiconductor substrate.

The following detailed description and the accompanying drawings provide a better understanding of the nature and advantages of the present invention.

DETAILED DESCRIPTION OF THE INVENTION

In accordance with embodiments of the invention, various techniques are described for forming a top-side contact to a bottom terminal of a semiconductor device. In one embodiment, a large recess is formed in the starting semiconductor substrate, and a semiconductor material is formed in the recess. The semiconductor material serves as the active region of the device where the device structure is formed, while the non-recessed portion(s) of the starting semiconductor substrate enables forming a top-side contact to the bottom terminal (i.e., the substrate) of the device. Given that the starting semiconductor substrate is typically of low resistivity material, the top-side contact would advantageously exhibit very low resistance. In one variation of the invention, a dielectric spacer extending along a sidewall of the recess is formed prior to forming the semiconductor material in the recess. This prevents lateral growth of the semiconductor material at the recess sidewalls and eliminates formation of bumps along the recess sidewalls during the process of forming the semiconductor material. These and other embodiments of the invention, as well as other features and advantages of the invention, will be described in more detail next.

Figure 2A:
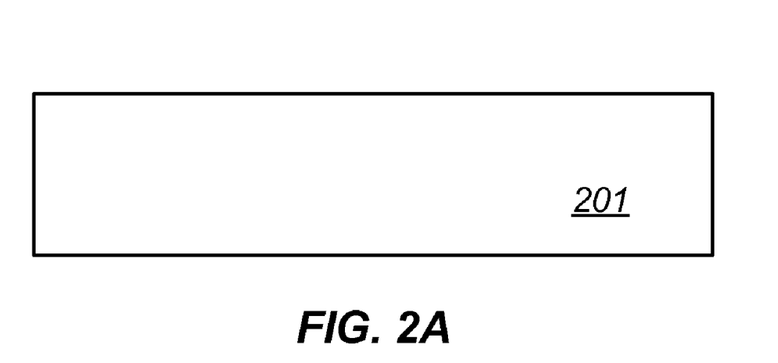
FIGS. 2A-2G are cross-sectional views illustrating a simplified process flow for forming a top-side contact to a bottom terminal of a device according to an embodiment of the present invention.

FIGS. 2A-2G are cross-sectional views illustrating a simplified process flow for forming a top-side contact to a bottom terminal of a device according to an embodiment of the present invention. FIG. 2A shows a starting semiconductor substrate 201. In one embodiment, semiconductor substrate 201 comprises silicon. In a particular embodiment, substrate 201 is a heavily doped p-type silicon substrate, having a resistively in the range of 5-7 mOhm-cm. Depending on the desired final structure, substrate 201 can be N-type or P-type. For example, if a vertical PMOS transistor is desired, P-type substrate is used, and if a vertical NMOS transistor is desired, N-type substrate is used. In other embodiments, substrate 201 comprises SiC or GaN. In one embodiment, substrate 201 is a silicon wafer with a thickness of about 200 µm.

Figure 2B:
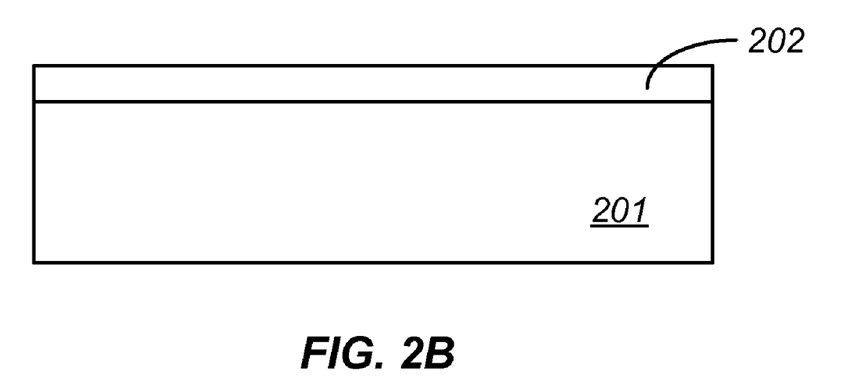

In FIG. 2B, a masking layer 202 is formed on substrate 201. Masking layer 202 is used for etching the semiconductor substrate. Therefore, a suitable masking material has an etch selectivity desirable for etching the semiconductor substrate. For example, in the embodiment where the substrate is a silicon wafer, masking layer 202 is a dielectric layer such as silicon dioxide or silicon nitride.

Figure 2C:
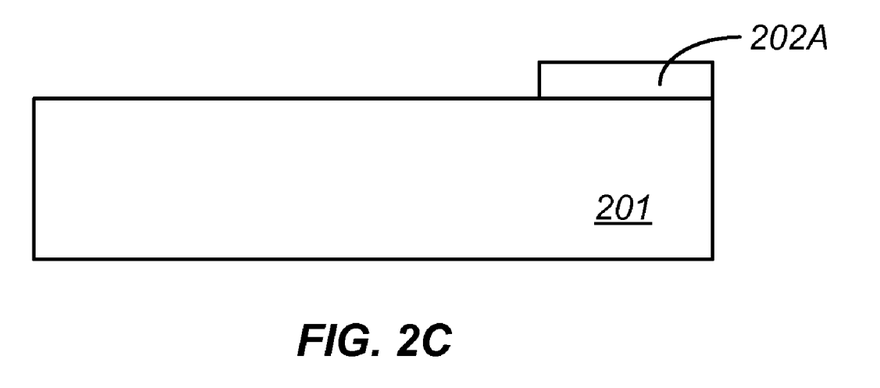
Figure 2D:
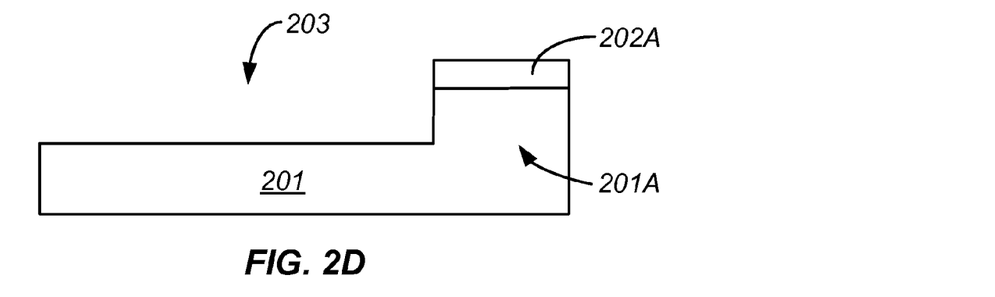

In FIG. 2C, a portion of masking layer 202 is selectively removed to expose one or more surface areas of substrate 201. A conventional photolithography and etching step can be used in this process. In FIG. 2D, the one or more exposed substrate surface areas are recessed to form one or more recesses 203 in substrate 201. For simplicity, only one recess will be used in describing this and subsequent embodiments, although it is to be understood that multiple recesses may be formed. In one embodiment, recess 203 is formed using a conventional silicon etch process. For example, a silicon plasma etch or reactive-ion etch process can be used. The depth of recess 203 is selected according to the requirements of specific device structure and performance. For higher voltage devices, a deeper recess may be formed, and for lower voltage devices, a shallower recess may be formed. In one exemplary embodiment, a low voltage vertical power MOSFET has a recess depth in the range of 2-30 µm. The thickness of masking layer 202 is selected as required by the substrate recess process. In one embodiment, an oxide layer having a thickness in the range of 3000-5000 Å is used as the masking layer for a silicon etch in the range of 4-6 µm. With masking layer portion 202A protecting a portion of substrate 201 during the recess process, a non-recessed region 201A of substrate 201 remains.

Figure 2E:
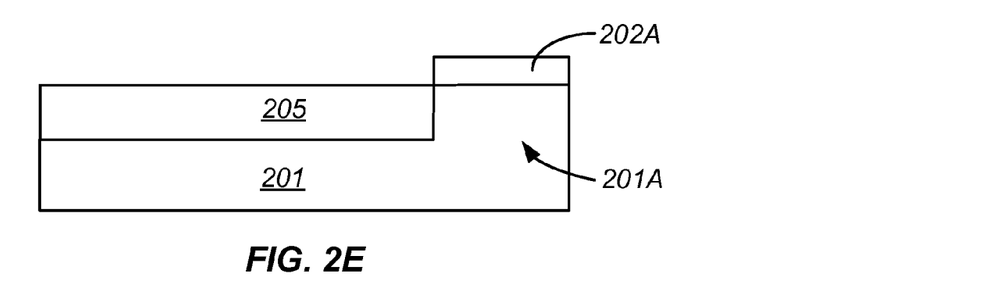

In FIG. 2E, recess 203 is substantially filled with a semiconductor material to form an active region 205. In one embodiment, this region comprises silicon. In another embodiment, active region 205 comprises SiGe. In yet another embodiment, a selective epitaxial growth (SEG) process is used to form silicon in active region 205. In an SEG process, an epitaxial silicon layer is formed in recess 203, but no silicon is formed over masking layer portion 202A. A conventional SEG process can be carried out in a low pressure or reduced pressure process to form active region 205.

Figure 2F:
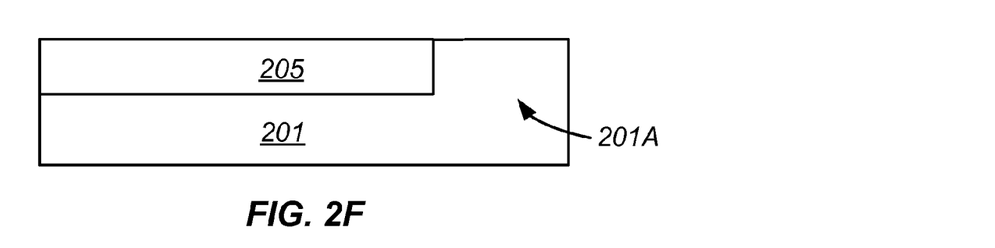

In FIG. 2F, masking layer portion 202A is removed by a conventional dielectric removal process. For example, where an oxide layer is used as masking layer 202, a wet or dry oxide etch process may be used to remove masking layer portion 202A. In another example, where a nitride layer is used as masking layer 202, a wet or dry nitride etch process can be used to remove masking layer portion 202A. During the epitaxial growth process, silicon growth on the sidewalls of recess 203 may lead to formation of bumps along the sidewalls of recess 203. Optionally, a silicon etch or polish process can be used to remove the bumps and obtain a planarized surface in region 205. For example, a chemical mechanical polishing process may be used.

Figure 2G:
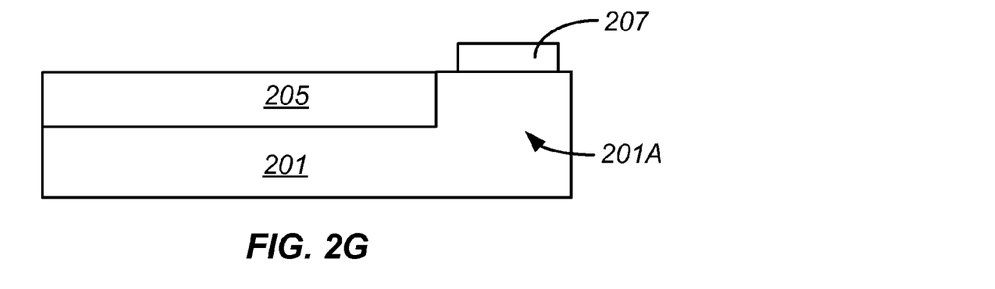

In FIG. 2G, a highly conductive interconnect layer 207 is formed on the non-recessed region 201A of substrate 201. Interconnect layer 207 may comprise metal, such as aluminum or copper. Interconnect layer 207 can be formed using a conventional metal deposition and patterning process. As shown, interconnect layer 207 and non-recessed region 201A form a top-side contact to substrate 201.

A device structure can now be formed in active region 205. In one embodiment, the doping concentration of active region 205 is selected according to the specific requirements of the device structure. For example, a vertical MOSFET can be fabricated in an active region 205 comprising silicon with a resistivity in the range of 0.2-0.4 ohm-cm, as discussed further below. In a specific embodiment, interconnect layer 207 is formed as part of the process for forming the device structure, and thus may be formed near the end of the full manufacturing process. In addition, the layout of non-recessed region 201A and interconnect layer 207 can be tailored to specific device applications. Two examples are described next.

Figure 3A:
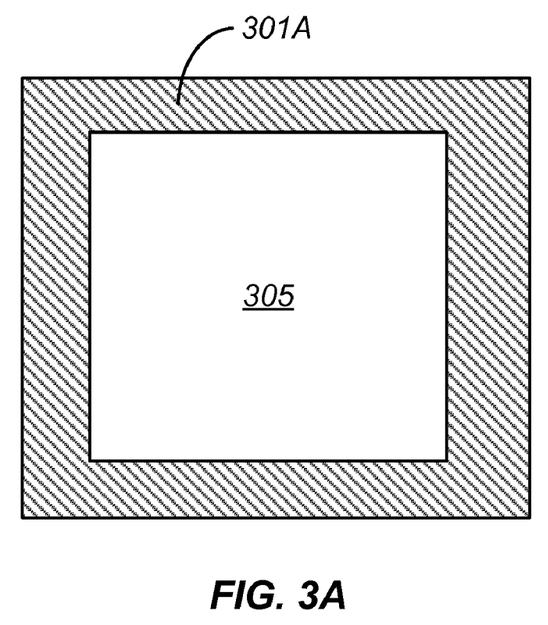
FIG. 3A is a layout diagram of a device with a top-side contact according to an embodiment of the present invention.

FIG. 3A is a top view of a device including a top-side contact to a bottom electrode according to an embodiment of the present invention. As shown, active region 305 is surrounded by non-recessed substrate region 301A. Non-recessed substrate region 301A is contiguous with the rest of the substrate (not shown) extending under active region 305. In one embodiment, active region 305 is formed using a process similar to that described above in connection with FIGS. 2A-2G. In a specific embodiment, active region 305 has a resistivity of, for example, in the range of 0.2-0.4 ohm-cm, suitable for forming low voltage vertical MOSFETs. In this embodiment, the substrate and its non-recessed region 301A has a relatively low resistivity, for example, in the range of 5-7 mOhm-cm. While only one ring of non-recessed substrate region is shown in FIG. 3A, multiples of such rings of same or varying widths with active regions between the rings can be formed.

Figure 3B:
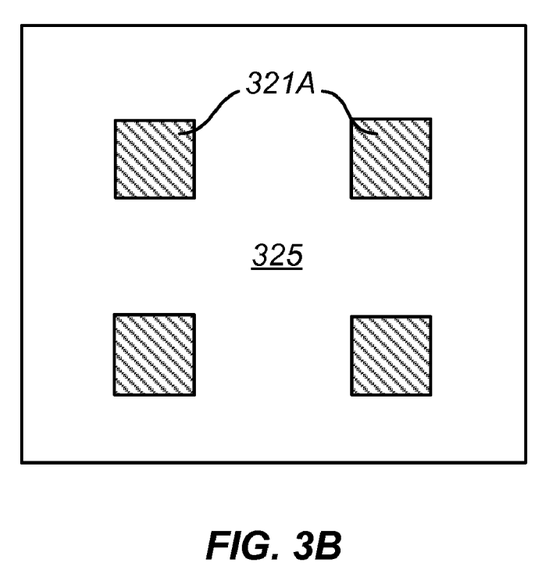
FIG. 3B is another layout diagram of a device with top-side contacts according to another embodiment of the present invention.

FIG. 3B is a top view of another device including a top-side contact to a bottom electrode according to an alternate embodiment of the present invention. As shown, FIG. 3B includes active region 325 and non-recessed substrate regions 321A. A device, such as a vertical MOSFET can be fabricated in active region 325. Non-recessed substrate regions 321A form contact regions to the substrate extending under active region 325. According to embodiments of the invention, the placement, size, number, and shape of the non-recessed substrate regions can be selected to achieve an optimum balance between silicon area consumption and resistance of the top-side contact to the substrate. For example, non-recessed regions 321A may be placed in one or more rows and/or columns, or in a diagonal or checkerboard configuration. Other placement configurations can be envisioned by one skilled in this art in view of this disclosure. Also, each non-recessed region 321A may have a square-shape as shown, or may alternatively be circular, hexagonal, rectangular or any other suitable geometrical shape.

Figure 4:
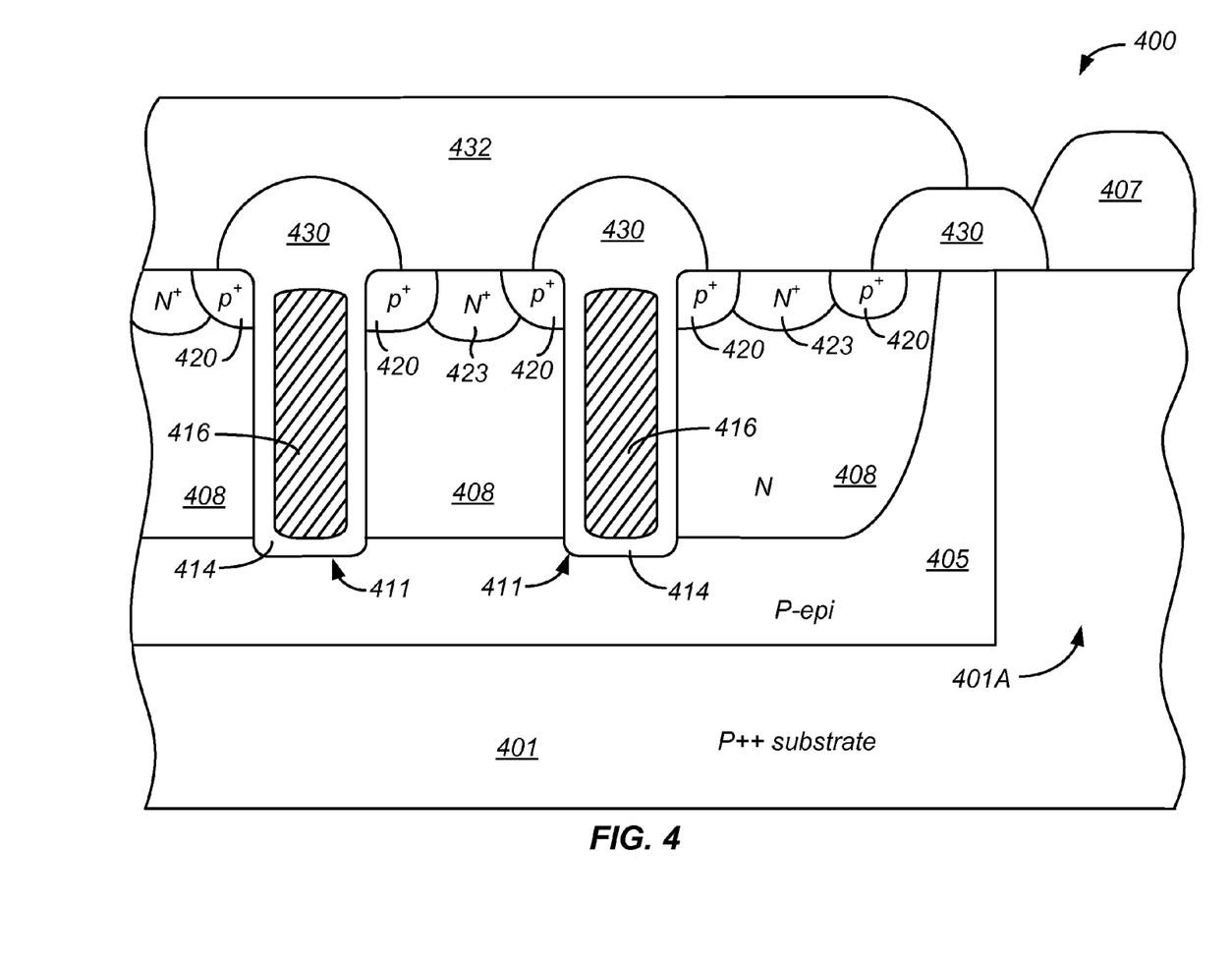
FIG. 4 is a cross sectional view illustrating how a vertically conducting trench gate MOSFET with a top-side contact to a back-side drain region is formed using the technique depicted by FIGS. 2A-2G.

FIG. 4 is a cross sectional view illustrate how a vertically conducting trench gate MOSFET with a top-side contact to a back-side drain region is formed using the technique depicted by FIGS. 2A-2G. MOSFET 400 includes a heavily doped P-type substrate 401 which embodies the drain of MOSFET 400. Substrate 401 includes a large recess filled with epitaxially formed P-type silicon 402. A highly conductive interconnect layer 407 (e.g., comprising a metal such as aluminum or copper) is formed on the non-recessed region 401A of substrate 401. Interconnect layer 407 together with non-recessed region 401A form a top-side drain contact to substrate 401. The large recess in substrate 401 and epitaxial layer 405 filling the large recess may be formed using the process described above in connection with FIGS. 2A-2G. The MOSFET formed in epitaxial layer 405 is described next.

An N-type body region 408 extending into epitaxial layer 405 is formed using known techniques. Trenches 411 extending through body region 408 and terminating below body region 408 are formed using conventional methods. The portion of epitaxial layer 405 extending between body region 408 and substrate 401 is commonly referred to as the drift region. A gate dielectric layer 414 (e.g., comprising oxide) lining the sidewalls and bottom of each trench 411 is formed using conventional techniques. In one embodiment, a thick bottom dielectric (e.g., comprising oxide) is formed in a bottom portion of trenches 411 before forming the gate dielectric.

Source regions 420 flanking trenches 411 are formed in body region 408 using known methods. Heavy body regions 423 are formed within body region 408 between adjacent source regions 420 using conventional techniques. Recessed gate electrodes 416 (e.g., comprising polysilicon) embodying the gate of MOSFET 400 are formed in trenches 411 using conventional methods. Dielectric cap 430 (e.g., comprising BPSG) covering trenches 411 and also partially extending over source regions 420 is formed using know techniques. A top-side highly conductive interconnect layer 432 (e.g., comprising a metal such as aluminum or copper) electrically contacting source regions 420 and heavy body regions 423 is formed using conventional methods. Top side interconnect layers 432 and 407 are insulated from one another by dielectric material (not shown). In one embodiment, interconnect layers 407 and 432 are formed in the same metal deposition and patterning steps.

Thus, as shown in FIG. 4, according to an embodiment of the invention, vertical P-channel MOSFET 400 has a top-side contact to the bottom drain region 401, in addition to top-side source contact to source and heavy body regions, and top-side contact to the gates (not shown). In another embodiment, the doping type of each region is reversed to form an N-channel MOSFET having top-side contacts to its source regions, body regions, and drain region. The invention is not limited to vertically conducting trench gate MOSFETs, and any conventional device with a back-side contact would benefit from the techniques of the present invention.

Figure 5A:
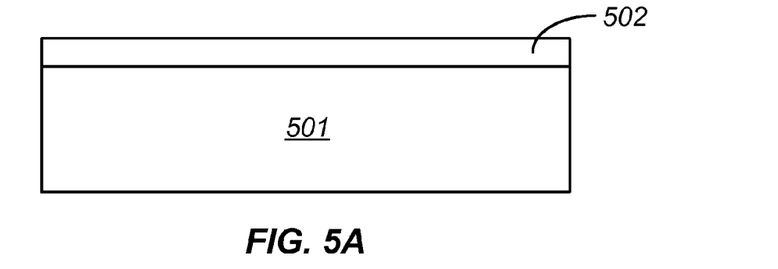
FIGS. 5A-5H are cross-sectional views illustrating another simplified process flow for forming a top-side contact to a bottom terminal of a device according to another embodiment of the present invention.

FIGS. 5A-5H are cross-sectional views illustrating another simplified process flow for forming a top-side contact to a bottom terminal of a device according to an alternative embodiment of the present invention. In FIG. 5A, a masking layer 502 is formed on a semiconductor substrate 501. In one embodiment, semiconductor substrate 501 comprises silicon. In a particular embodiment, substrate 501 is a heavily doped P-type silicon substrate, having a resistivity in the range of 5-7 mOhm-cm. Depending on the application, substrate 501 can be N-type or P-type. In other embodiments, substrate 501 may comprise SiC or GaN. In one embodiment, masking layer 502 has an etch selectivity desirable for silicon etching. For a substrate that comprises silicon, masking layer 502 can be a dielectric layer, such as silicon dioxide or silicon nitride. The thickness of masking layer is selected as required by the silicon etch process.

Figure 5B:
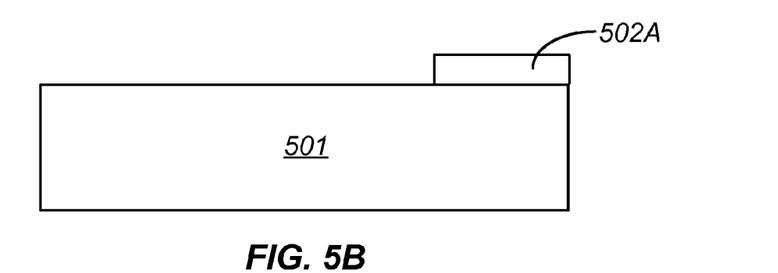
Figure 5C:
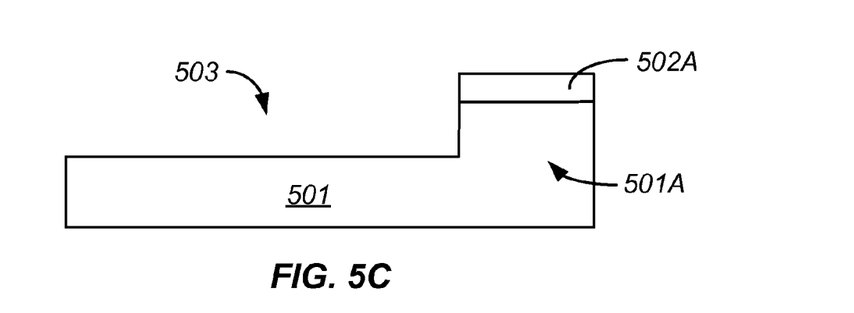

In FIG. 5B, masking layer 502 is selectively removed to expose a surface portion of substrate 501. A conventional photolithography and etching step can be used in this process. In FIG. 5C, substrate 501 is recessed through the opening in masking layer 502 to form a recess 503 in substrate 501. A process similar to that described above in connection with FIG. 2D can be used. With masking layer portion 502A protecting a portion of the substrate, non-recessed portion 501A of substrate 501 remains.

Figure 5D:
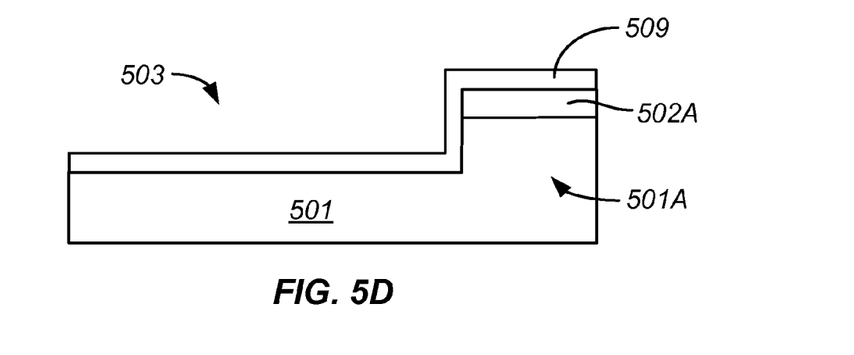
Figure 5E:
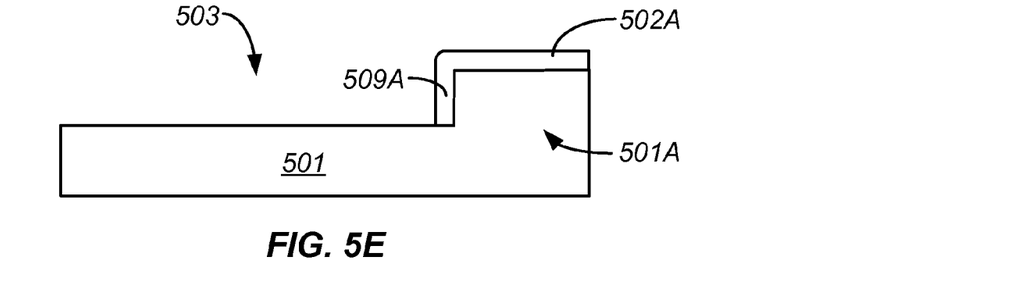

In FIG. 5D, a dielectric layer 509 is formed along a bottom surface and sidewalls of recess 503, and over masking layer portion 502A. Dielectric layer 509 may comprise the same material as masking layer 502. In one embodiment, dielectric layer 509 is an oxide or a nitride layer. In FIG. 5E, an etch back process is performed to remove the dielectric layer 509 only from the bottom surface of recess 503. As a result, a spacer 509A is formed along the sidewall of recess 503. All or part of masking layer portion 502A remains over non-recessed region 501A of the substrate. In one embodiment, the initial thickness of masking layer 502 is approximately 2000 Å, and the initial thickness of dielectric layer 509 is also about 2000 Å. After the etch back step to form spacer 509A, dielectric layer 509 is completely removed from the bottom of recess 503, and a thickness of approximately 1000-1500 Å of masking layer 502 remains over the non-recessed region 501A. It is desirable that after the etch back step, the sidewall of recess 503 and the non-recessed region 501A remain covered by dielectric material so that the subsequent steps can be carried out properly.

Figure 5F:
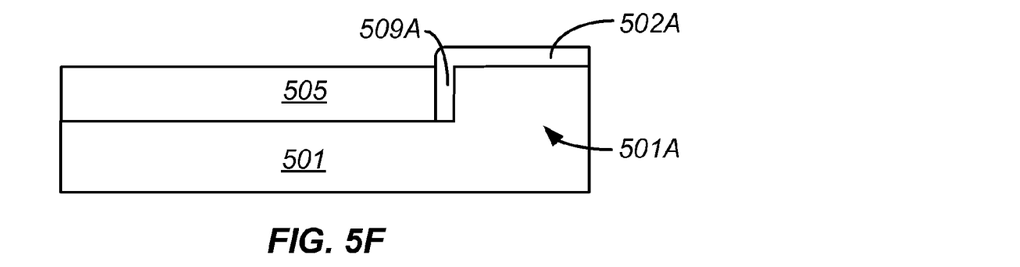

In FIG. 5F, recess 503 is filled with a semiconductor material to form an active region 505. In one embodiment, active region 505 comprises silicon. In another embodiment, active region 505 comprises SiGe. In yet another embodiment, a selective epitaxial growth (SEG) process is used to form silicon in recess 503, but not over dielectric layer portion 502A, as discussed above in connection with FIG. 2E. In a specific embodiment, spacer 509A prevents the formation of silicon bumps along the sidewall of recess 503.

Figure 5G:
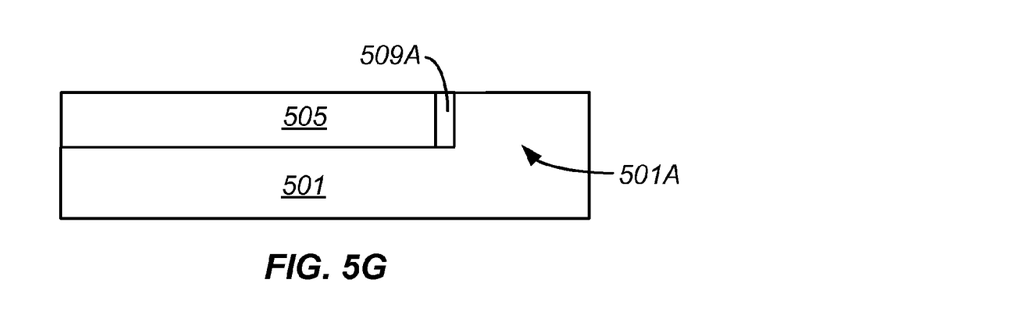
Figure 5H:
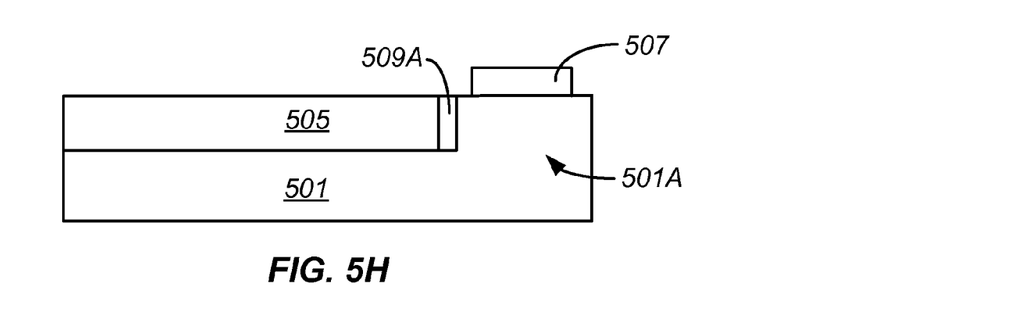

In FIG. 5G, masking layer portion 502A is removed by a conventional dielectric removal process. For example, a wet or dry oxide etch process may be used. Alternative a plasma etch process may be used. In FIG. 5H, a highly conductive interconnect layer 507 is formed on non-recessed region 501A, using a process similar to that described above in connection with FIG. 2G. As shown, interconnect layer 507 makes electrical contact with substrate 501 via non-recessed region 501A of the substrate. As shown in FIG. 5G, active region 505 is separated from non-recessed region 501A by spacer 509A.

A device structure can now be formed in active region 505. For example, a vertical MOSFET can be fabricated in silicon region 505. In a specific embodiment, conductive region 507 is formed as part of the process for forming the device structure. The layout of non-recessed region 501A can be tailored to specific device applications, as described above in connection with FIGS. 3A and 3B.

Figure 6:
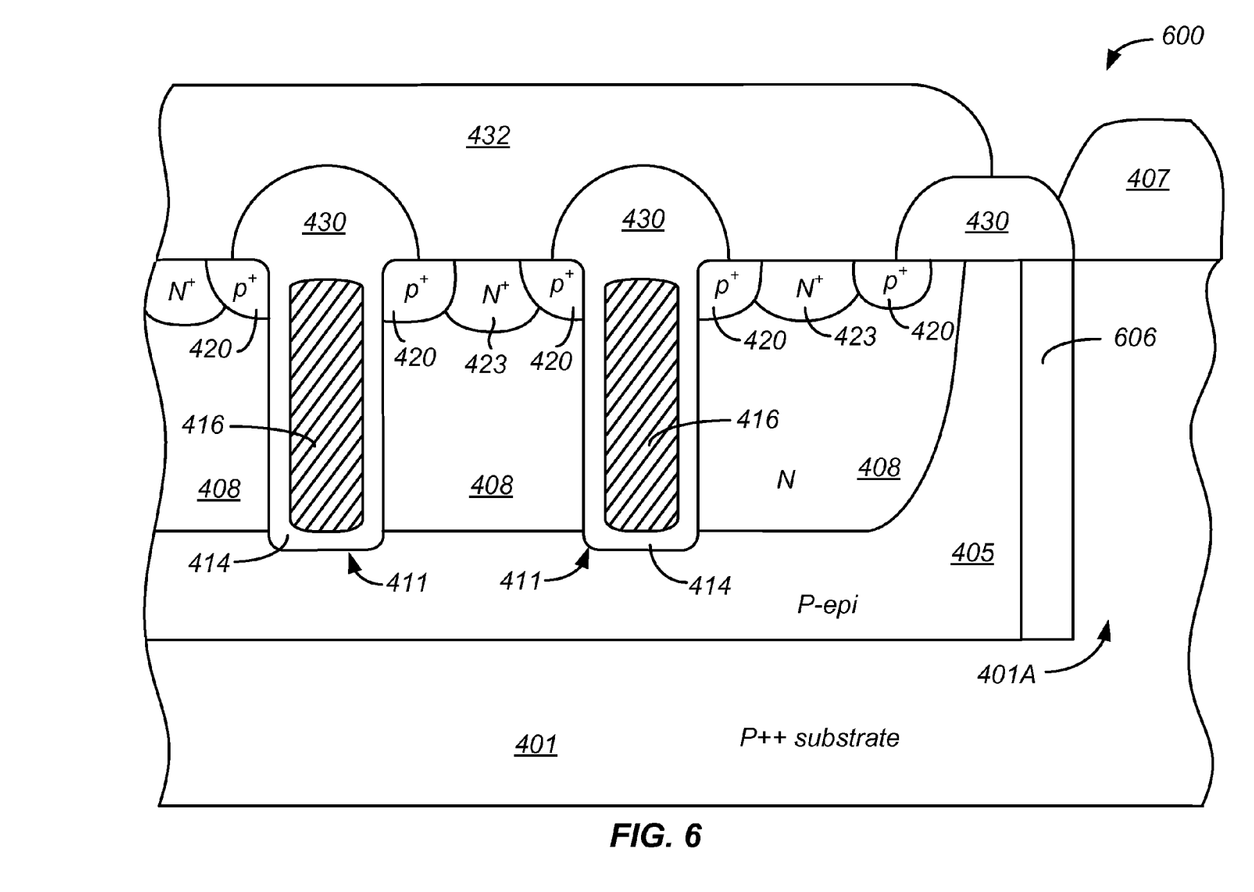
FIG. 6 is a cross sectional view illustrating how a vertically conducting trench gate MOSFET with a top-side contact to a back-side drain region is formed using the technique depicted by FIGS. 5A-5G.

FIG. 6 is a cross sectional view illustrating how a vertically conducting trench gate MOSFET with a top-side contact to a back-side drain region is formed using the technique depicted by FIGS. 5A-5G. As shown, MOSFET 600 is a vertically conducting MOSFET similar in structure to MOSFET 400 in FIG. 4. Corresponding device regions are marked with identical reference numerals. A difference between MOSFET 600 and MOSFET 400 is that MOSFET 600 includes a dielectric spacer 606 vertically extending between active region 405 and the non-recessed region 401A of substrate 401. Dielectric spacer 606 is formed prior to forming active region 405 in a similar manner to spacer 509A as described above in connection with FIGS. 5A-5H. Top-side contact to substrate 401 is provided by interconnect layer 407 and the non-recessed region 401A. In MOSFET 600, top-side contacts to sources 420 and body 408 are provided by interconnect layer 432. In a specific embodiment, interconnect layers 407 and 432 are formed in the same metal deposition and patterning steps.

Many benefits are obtained by way of the present invention over conventional techniques. For example, the present technique fills a recess area with epitaxially grown silicon. This leaves less topography irregularity and puts less demand on photolithography. Also, the top-side and back side of the wafer are connected via non-recessed regions of a substrate that is uniformly and highly doped. As compared to the conventional implant and high temperature drive-in process shown in FIG. 1B Additionally, the above-described embodiments of the invention provide a lower top-side contact resistance, require a lower thermal budget, and result in a top-side structure that consumes less silicon area since no out-diffusion occurs. As compared to the conventional trench sinker technique in FIG. 1C, embodiments of the present invention provide a less complex process since no deep and narrow trenches which are difficult to fill need to be formed. Further, the top-side contact formed according to embodiments of the present invention advantageously allow discrete MOSFET devices to be used in CSP (Chip-Scale Packaging) products where back-side contacts are impediments to the packaging process.

While the above is a complete description of specific embodiments of the present invention, various modifications, variations, and alternatives may be employed. For example, while the invention is illustrated using trench gate MOSFETs, the invention could easily be applied to other trench-gate structures such as trench gate IGBTs by merely reversing the polarity of the substrate from those shown in FIGS. 4 and 6. Similarly, the process sequences depicted are for P-channel FETs, but modifying these process sequences to form N-channel FETs would be obvious to one skilled in the art in view of this disclosure. Further, the invention is not limited to trench gate structures and may be used in forming any device where it is desirable to bring the back-side contact to the top side. Such devices include vertically conducting planar gate MOSFETs and IGBTs (which have the gate extending laterally over the silicon mesa), shielded gate FETs (which have trenched gates with underlying shield electrode(s)), and vertically conducting rectifiers (including schottky rectifiers, TMBS rectifiers, etc.). Hence, the scope of this invention should not be limited to the embodiments described, but are instead defined by the following claims.

What is claimed is:

1. A semiconductor structure comprising:
   a starting semiconductor substrate having a recessed portion and a non-recessed portion;
   a semiconductor material in the recessed portion, the semiconductor material having a higher resistivity than the starting semiconductor substrate;
   a body region extending in the semiconductor material, the body region and the semiconductor material being of opposite conductivity type;
   source regions in the body region, the source and body regions being of opposite conductivity type;
   a gate electrode extending adjacent to but being insulated from the body region; and
   a first interconnect layer extending over and in contact with the non-recessed portion of the starting semiconductor substrate, the first interconnect layer and the non-recessed portion providing a top-side electrical contact to portions of the starting semiconductor substrate underlying the semiconductor material.

2. The semiconductor structure of claim 1 wherein the starting semiconductor substrate comprises silicon.

3. The semiconductor structure of claim 1 wherein the recessed portion is substantially filled with an epitaxial layer.

4. The semiconductor structure of claim 1 wherein the starting semiconductor substrate is characterized by a resistivity in the rang of 5-7 mOhm-cm, and the semiconductor material is characterized by a resistivity in the range of 0.2 to 0.4 Ohm-cm.

5. The semiconductor structure of claim 1 wherein the semiconductor material has the same conductivity type as the starting semiconductor substrate.

6. The semiconductor structure of claim 1 wherein the semiconductor material has a different conductivity type than the starting semiconductor substrate.

7. The semiconductor structure of claim 1 wherein the vertically conducting device further comprises:
   a heavy body region in the body region; and
   a second interconnect layer electrically contacting the source regions and the heavy body region, the second interconnect layer being insulated from the first interconnect layer.

8. A semiconductor structure, comprising:
   a starting semiconductor substrate having a recessed portion and a non-recessed portion;
   a semiconductor material in the recessed portion, the semiconductor material having a higher resistivity than the starting semiconductor substrate;
   a dielectric spacer vertically extending between the semiconductor material and the non-recessed portion of the starting semiconductor substrate;
   a body region extending in the semiconductor material, the body region and the semiconductor material being of opposite conductivity type;
   source regions in the body region, the source and body regions being of opposite conductivity type;
   a gate electrode extending adjacent to but being insulated from the body region; and
   a first interconnect layer extending over and in contact with the non-recessed portion of the starting semiconductor substrate, the first interconnect layer and the non-recessed portion providing a top-side electrical contact to portions of the starting semiconductor substrate underlying the semiconductor material.

9. The semiconductor device of claim 8 wherein the starting semiconductor substrate comprises silicon.

10. The semiconductor device of claim 8 wherein the dielectric spacer comprises oxide.

11. The semiconductor device of claim 8 wherein the recessed portion is substantially filled with an epitaxial layer.

12. The semiconductor device of claim 8 wherein the starting semiconductor substrate is characterized by a resistivity in the range of 5 to 7 mOhm-cm, and the semiconductor material is characterized by a resistivity in the range of 0.2 to 0.4 Ohm-cm.

13. The semiconductor device of claim 8 wherein the semiconductor material has the same conductivity type than the starting semiconductor substrate.

14. The semiconductor device of claim 8 wherein the semiconductor material has a different conductivity type than the starting semiconductor substrate.

15. The semiconductor device of claim 8 wherein the vertically conducting device further comprises:
   a heavy body region in the body region; and
   a second interconnect layer electrically contacting the source regions and the heavy body region, the second interconnect layer being insulated from the first interconnect layer.

* * * * *